US006469314B1

United States Patent
Grillot et al.

(10) Patent No.: US 6,469,314 B1
(45) Date of Patent: Oct. 22, 2002

(54) THIN MULTI-WELL ACTIVE LAYER LED WITH CONTROLLED OXYGEN DOPING

(75) Inventors: Patrick N. Grillot; Eugene I. Chen; Jen-Wu Huang, all of Santa Clara; Stephen A. Stockman, Morgan Hill, all of CA (US)

(73) Assignee: LumiLeds Lighting U.S., LLC, San Jose, CA (US)

( * ) Notice: Subject to any disclaimer, the term of this patent is extended or adjusted under 35 U.S.C. 154(b) by 0 days.

(21) Appl. No.: 09/467,941

(22) Filed: Dec. 21, 1999

(51) Int. Cl.$^7$ ............................................... H01L 31/00
(52) U.S. Cl. .............................. 257/15; 257/14; 257/94; 257/102; 257/103; 257/104
(58) Field of Search ............................. 257/14, 15, 94, 257/102–104

(56) References Cited

U.S. PATENT DOCUMENTS 5,296,717 A * 3/1994 Valster et al. .................. 257/13

(List continued on next page.)

FOREIGN PATENT DOCUMENTS

DE          199 11 701        2/2000     ........... H01L/33/00

(List continued on next page.)

OTHER PUBLICATIONS

Gardner, N. F. et al.: "1.4x effciency improvement in transparent–substrate $(Al_xGa_{1-x})_{0.5}In_{0.5}P$ light–emitting diodes with thin ($\leq$2000 Å) active regions" Applied Physics Letters, American Institute of Physics. New York, US, vol. 74, No. 15, Apr. 12, 1999, pp. 2230–2232, XP000829869, ISSN: 0003–6951.

Primary Examiner—Nathan J. Flynn
Assistant Examiner—Ahmed N. Sefer
(74) Attorney, Agent, or Firm—Skjerven Morrill LLP; Norman R. Klivans

(57) ABSTRACT

An LED and a method of fabricating the LED which utilize controlled oxygen (O) doping to form at least one layer of the LED having an O dopant concentration which is correlated to the dominant emission wavelength of the LED. The O dopant concentration is regulated to be higher when the LED has been configured to have a longer dominant emission wavelength. Since the dominant emission wavelength is dependent on the composition of the active layer(s) of the LED, the O dopant concentration in the layer is related to the composition of the active layer(s). The controlled O doping improves the reliability while minimizing any light output penalty due to the introduction of O dopants. In an exemplary embodiment, the LED is an AlGaInP LED that includes a substrate, an optional distributed Bragg reflector layer, an n-type confining layer, an optional n-type set-back layer, an active region, an optional p-type set-back layer, a p-type confining layer and an optional window layer. In a preferred embodiment, the active region includes a multiplicity of active layers, where each active layer is 125 Angstroms thick or less and the active layers are separated from each other by barrier layers whose composition is $Al_{0.5}In_{0.5}P$ and whose thickness is 100 Angstroms or less. In a preferred embodiment, both the p-type confining layer and the p-type set-back layer are doped with a controlled amount of O, depending on the dominant emission wavelength of the LED. In addition to the O doping, the p-type confining layer of the LED is preferably doped with a high amount of p-type dopants, such as Mg, Zn, C or Be. During high temperature thermal processing, this high concentration of p-type dopants then partially diffuses into the active region, resulting in a heavily p-type doped active region.

26 Claims, 8 Drawing Sheets

U.S. PATENT DOCUMENTS

| | | | |
|---|---|---|---|
| 5,410,159 A | | 4/1995 | Sugawara et al. ............. 257/13 |
| 5,661,742 A | | 8/1997 | Huang et al. ................. 372/46 |
| 5,780,867 A | * | 7/1998 | Fritz et al. .................... 257/13 |
| 5,822,347 A | * | 10/1998 | Yokogawa et al. ........... 372/45 |
| 5,909,051 A | | 6/1999 | Stockman et al. .......... 257/610 |
| 6,057,562 A | * | 5/2000 | Lee et al. ..................... 257/96 |
| 6,081,540 A | * | 6/2000 | Nakatsu ....................... 372/45 |
| 6,181,723 B1 | * | 1/2001 | Okubo et al. ................. 372/45 |
| 2001/0020703 A1 | * | 9/2001 | Gardner et al. ............... 257/87 |

FOREIGN PATENT DOCUMENTS

| | | | |
|---|---|---|---|
| EP | 0 924 824 | * | 6/1999 |
| EP | 0924824 | * | 6/1999 |
| EP | 0924824 A2 | * | 6/1999 |

* cited by examiner

US 6,469,314 B1

THIN MULTI-WELL ACTIVE LAYER LED WITH CONTROLLED OXYGEN DOPING

TECHNICAL FIELD

The invention relates generally to light emitting devices and more particularly to a light emitting diode with improved brightness and reliability and to a method of fabricating the light emitting diode.

BACKGROUND ART

Traditional lighting sources such as fluorescent lights, incan-descent lights, and neon lights have a number of disadvantages relative to light emitting diodes (LEDs). These disadvantages include their large sizes, the lack of durability due to the use of fragile filaments, short operating lifetimes, and high operating voltages. In contrast, LEDs are small in size, durable and require low operating voltages. Furthermore, LEDs have much longer operating lifetimes. A typical LED has an operating life of 10,000 hours or more, as compared to a halogen lamp which has a mean operating life of 500 to 4,000 hours. Furthermore, unlike the traditional lighting sources which fail by filament breakage, an LED fails by a gradual reduction in light output. Therefore, many lighting applications could benefit from the advantages of LEDs. However, to effectively compete with the traditional lighting sources, LEDs must be bright and must maintain their brightness over their expected operating lifetime, i.e., they must be reliable.

Many attempts have been made to improve the brightness of LEDs through various design changes. For example, improvements in LED brightness have been achieved by the use of more than one light emitting layer, where these light emitting layers are commonly known as active layers. These LEDs are referred to as either multi-well (MW) LEDs if the layer thickness values are greater than 100 Angstroms, or they are referred to as multiple quantum well (MQW) LEDs if the layer thickness values are less than approximately 100 Angstroms. The distinction between these two different types of LEDs is whether the layers are thin enough for quantum confinement effects to become important, i.e., for discrete or quantized energy states to occur in the active layers. (This generally occurs for well thickness values less than approximately 100 Angstroms and depends on the energy band structure of the materials in question.) In contrast, LEDs having a single active layer will be referred to as either double heterostructure (DH) LEDs, or as single quantum well (SQW) LEDs, again depending on whether the individual active layer thickness values are greater than or less than approximately 100 Angstroms, respectively. Further improvements have been attempted by adjusting the number and/or thickness of the active layers. For example, U.S. Pat. No. 5,410,159 to Sugawara et al. describes an MQW LED having eight to nineteen active layers, preferably ten to nineteen, in which the thickness of the active layers is 10 to 100 Angstroms, and more typically 50 Angstroms. The device described by Sugawara et al. is thus restricted to the quantum regime.

A conventional MQW LED is schematically illustrated in FIG. 1. (Note that this LED in FIG. 1 could also represent an MW LED.) The LED 10 includes a substrate 12 of a first conductivity type, a lower confining layer 14 of the first conductivity type, the MQW active region 16 which may be of the first conductivity type, may be undoped, or may be of a second conductivity type, an upper confining layer 18 of the second conductivity type, and an optional window layer 20 of the second conductivity type. The MQW active region includes two or more active layers 22 that are separated from each other by one or more barrier layers 24. Although the MQW active region is shown to include four active layers, the number of active layers included in the active region can be much greater.

In the most common configuration, the first conductivity type is ntype and the second conductivity type is p-type. Since this is the most common LED configuration, such a configuration will be used here as an example. In this configuration, the n-type lower confining layer 14 of the LED 10 in FIG. 1 is electrically connected to an n-type ohmic contact 26 via the substrate 12, and the p-type upper confining layer 18 or the optional window layer 20 is electrically connected to a p-type ohmic contact 28. (Note that it is also possible to form an LED where the first conductivity type is p-type and the second conductivity type is n-type. Such an LED may be formed by either growing the LED on a p-type substrate, or bonding or attaching the LED to a p-type substrate or other p-type semiconductor material.)

When a potential is applied to the ohmic contacts 26 and 28, electrons are injected into the MQW active region 16 from the n-type lower confining layer 14 and holes are injected into the MQW active region from the p-type upper confining layer 18. The radiative recombination of electrons and holes within the active layers 22 of the active region generates light. However, when the recombination occurs within the lower confining layer, the upper confining layer, or the barrier layers of the active region, no light is generated. Thus, it is desirable to increase the probability that the electrons and holes recombine within the active layers, as opposed to recombining within some other layers of the LED. The multiple quantum wells formed by the active layers of the LED increase the radiative recombination probability by allowing holes or electrons that did not recombine in one of the active layers a chance to recombine in another active layer. The increase in radiative recombination of electrons and holes within the active layers equates to an increase in the light output of the LED.

With respect to the reliability issue, U.S. Pat. No. 5,909,051 to Stockman et al., which is assigned to the assignee of the present invention, describes a method of doping at least one conductive region adjacent to the active region with impurities to fabricate minority carrier devices, such as an AlGaInP LED, having an increased operating stability, i.e., reliability. In a preferred embodiment, the impurities that are introduced to the conductive region are oxygen dopant atoms. Note that the fabrication method of Stockman et al. asserts that the oxygen dopant atoms should be placed in a region adjacent to the active region.

A concern with conventional fabrication methods and the resulting devices, such as those described in Stockman et al., is that improvement in LED brightness and improvement in LED reliability are often in an inverse relationship. Therefore, an improvement in one parameter often results in a penalty in the other parameter. In particular, the method of Stockman et al. provides improved LED reliability. However, it often also results in a penalty in initial light output. Although the method of Stockman et al. results in a more stable light output, these devices with oxygen doping are thus initially dimmer than devices without oxygen doping.

Although improvements in either brightness (i.e., light output as measured by $I_v$ in units of $\mu Cd$) or in reliability of LEDs may be achieved by conventional methods, additional improvements that minimize any penalizing effects on the other parameter are desired. Therefore, what is needed is an LED fabrication method and a resulting LED that has been configured to optimally improve both the brightness and the reliability of the LED.

SUMMARY OF THE INVENTION

An LED and a method of fabricating the LED utilize controlled oxygen (O) doping to form at least one layer of the LED having an O dopant concentration which is correlated to the dominant emission wavelength of the LED. The O dopant concentration is regulated to be higher when the LED has been configured to have a longer dominant emission wavelength. Since the dominant emission wavelength is dependent on the composition of the active layer(s) of the LED, the O dopant concentration in the layer is related to the composition of the active layer(s). The controlled O doping improves the reliability while minimizing any light output penalty due to the introduction of O dopants.

In an exemplary embodiment, the LED is an AlGaInP LED that includes a substrate, an optional distributed Bragg reflector layer, a lower confining layer, an optional lower set-back layer, an active region, an optional upper set-back layer, an upper confining layer, and an optional window layer. The substrate is made of a semiconductor material, such as GaAs. The lower confining layer is composed of an n-type $(Al_xGa_{1-x})_yIn_{1-y}P$ material, where $x \geq 0.6$ and $y=0.5\pm0.1$, while the upper confining layer is composed of a p-type $(Al_xGa_{1-x})_yIn_{1-y}P$ material where $x \geq 0.6$ and $y=0.5\pm0.1$. The optional upper set-back layer is formed of an undoped $(Al_xGa_{1-x})_yIn_{1-y}P$ material where $x \geq 0.6$ and $y=0.5\pm0.1$. The optional upper set-back layer may be used to help control the diffusion of p-type dopants from the upper confining region into the active region during high temperature processing steps. The optional lower set-back layer may also be formed of an undoped or n-type $(Al_xGa_{1-x})_yIn_{1-y}P$ material where $x \geq 0.6$ and $y=0.5\pm0.1$. The optional upper and lower set-back layers also generally have an aluminum composition, x, which is less than or equal to the aluminum composition of the upper and lower confining layers, although this is not necessarily the case.

In one embodiment, only the upper confining layer of the LED is doped with a controlled amount of O. Note that the upper set-back layer, which is adjacent to the active region, is not doped with O in this configuration. If the LED is configured to have a dominant emission wavelength less than approximately 595 nm, the O concentration in the upper confining layer of the LED is between about $3 \times 10^{17}$ cm$^{-3}$ and $2 \times 10^{18}$ cm$^{-3}$. If the LED is configured to have a dominant emission wavelength between approximately 595 nm and approximately 620 nm, the O concentration is between about $4 \times 10^{17}$ cm$^{-3}$ and $4 \times 10^{18}$ cm$^{-3}$, preferably about $3 \times 10^{18}$ cm$^{-3}$. If the LED is configured to have a dominant emission wavelength greater than approximately 620 nm, the O concentration in the upper confining layer is between about $5 \times 10^{17}$ cm$^{-3}$ and $5 \times 10^{18}$ cm$^{-3}$. However, the O concentration for an LED with a dominant emission wavelength greater than approximately 626 nm can be higher than $5 \times 10^{18}$ cm$^{-3}$. The rationale for the different O concentrations is that the light output penalty which is commonly associated with O doping was found to be dependent on the dominant emission wavelength. A shorter dominant emission wavelength equates to a greater light output penalty than a longer dominant emission wavelength. In fact, for a dominant emission wavelength greater than 626 nm, there is an improvement in the light output by the use of O doping. Therefore, by controlling the O concentration in the p-type confining layer, the light output penalty associated with the O doping can be mitigated.

In an alternative embodiment, the p-type set-back layer of the LED is doped with a controlled amount of O, such that the p-type set-back layer contains an oxygen concentration $<5 \times 10^{18}$ cm$^{-3}$, and preferably $<1 \times 10^{17}$cm$^{-3}$, where the preferred O concentration in the p-type set-back layer decreases with decreasing dominant emission wavelength. In this case, the upper confining layer, which is not adjacent to the active region, is also O doped.

In addition to the O doping, the upper confining layer of the LED is preferably doped with an increased amount of p-type dopants, such as Mg, Zn, C, or Be. Prior to high temperature thermal processing, the resulting upper confining layer has a p-type dopant concentration between approximately $1 \times 10^{17}$ cm$^{-3}$ and $1 \times 10^{19}$ cm$^{-3}$. Subsequent high temperature thermal processing then results in p-type dopant diffusion into the active region, resulting in a heavily p-doped active region with a free hole concentration between approximately $1 \times 10^{17}$ cm$^{-3}$ and $3 \times 10^{18}$ cm$^{-3}$, preferably between $3 \times 10^{17}$ cm$^{-3}$ and $6 \times 10^{17}$ cm$^{-3}$.

The active region of the LED may include a single light emitting active layer or multiple light emitting active layers. For an LED with multiple light emitting active layers, the total active layer thickness D is defined as the sum of the thicknesses of all the light emitting layers in the active region. As an example, an LED with N light emitting layers, each layer of equal thickness t, the total active layer thickness would be given by Eq. 1 as:

$$D=Nt \qquad (1)$$

For a fixed total active layer thickness, D, it has been found that an increased number of light emitting layers equates to an increase in the light output of the device. An increase in the number of light emitting layers for a fixed total active layer thickness means that the target thickness of the individual light emitting layers is also reduced. The preferred total active layer thickness is in the range from about 500 Angstroms to about 2000 Angstroms for an amber LED (dominant wavelength<approximately 595 nm) or an orange LED (dominant wavelength between approximately 595 nm and 610 nm), while the preferred total active layer thickness is in the range from about 125 Angstroms to about 1000 Angstroms for a red-orange LED (dominant wavelength between approximately 610 nm and 620 nm) or red LED (dominant wavelength>approximately 620 nm). Therefore, if the LED is configured to have a dominant emission wavelength in the amber to orange portion of the light spectrum, the active region includes multiple light emitting layers, ranging in number from approximately eight to approximately sixteen emitting layers, each light emitting layer being approximately 125 Angstroms thick or less. However, if the LED is configured to have a dominant emission wavelength in the red or red-orange portion of the light spectrum, the active region includes multiple light emitting layers, ranging in number from one to approximately eight light emitting layers, each light emitting layer also being approximately 125 Angstroms thick or less. The optimal thickness for these different color LEDs depends on whether the device includes an absorbing substrate (AS) material such as GaAs, or whether the device has been grown on or bonded or otherwise attached to a non-absorbing or transparent substrate (TS) such as GaP, glass, or some other non-absorbing material. The thicker values within the above ranges are preferred for absorbing substrate devices while the thinner values are preferred for transparent substrate devices. Note that the present invention, which is based in part on the concept of reducing the individual active layer thickness, t, and hence increasing the number of active layers, N, will work for layer thicknesses well down into the quantum regime, i.e., for thicknesses down to approximately 10 Angstroms. In such cases, the number of wells, N, may be as high as 50 or more.

The active region of the LED includes N-1 barrier layers that are positioned between two adjacent light emitting layers, where N is the number of light emitting layers included in the active region. It was also found that the light output can be increased by decreasing the thickness of the barrier layers and/or increasing the energy bandgap of the barrier layers. In view of this finding, the thickness of the barrier layers is less than 350 Angstroms, and is preferably 100 Angstroms or less. In addition, the composition of the barrier layers is $(Al_xGa_{1-x})_yIn_{1-x}P$, where x0.6 and y=0.5±0.1. In the preferred embodiment, the composition of the barrier layers is $Al_{0.5}In_{0.5}P$, where y=0.5±0.1, and the barrier layers are 100 Angstroms thick or less.

An advantage of the invention is that the unique combination of thin wells, thin barriers, AlInP barrier composition, set-back layer composition, and high doping concentrations of oxygen and acceptor atoms (such as Mg, Zn, Be, or C) allow the light output and reliability to be decoupled to a greater extent than has been observed in prior LED designs. The invention therefore allows simultaneous improvements in both brightness and reliability, as shown in FIGS. 6 and 7 below.

DETAILED DESCRIPTION

Figure 1:
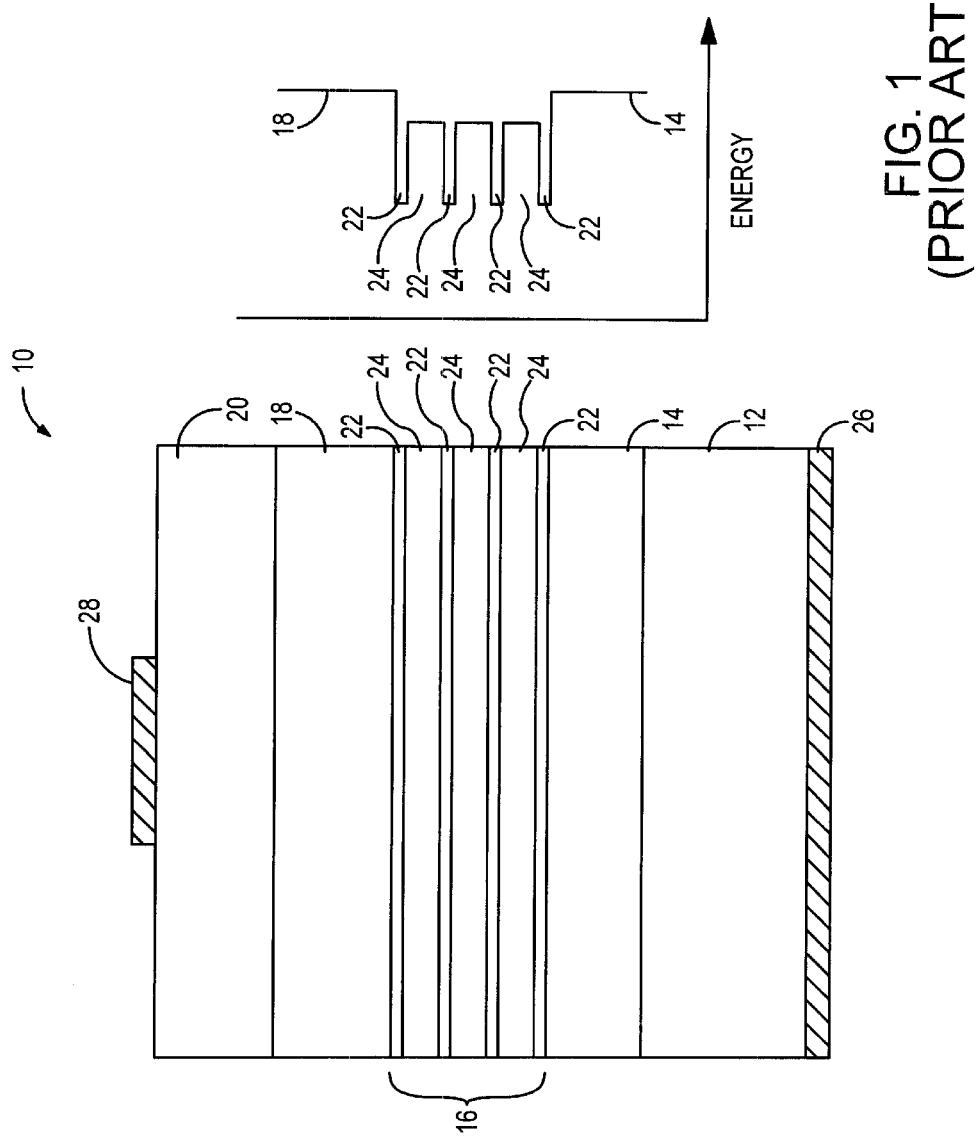
FIG. 1 is a schematic diagram of a prior art MQW LED.
Figure 2:
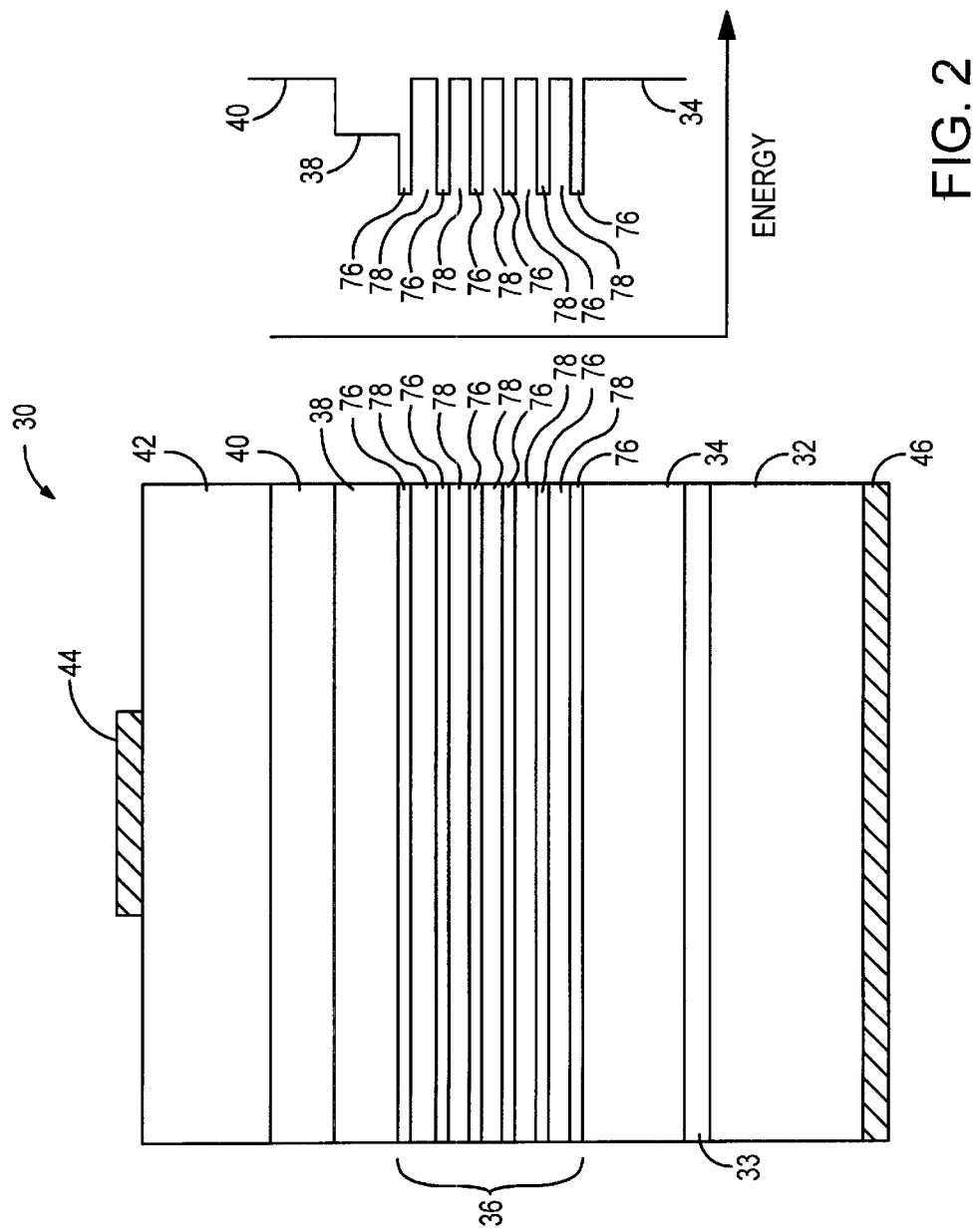
FIG. 2 is a schematic diagram of an AlGaInP LED in accordance with an exemplary embodiment of the present invention.

With reference to FIG. 2, an LED 30 in accordance with an exemplary embodiment is shown. In this exemplary embodiment, the LED is an AlGaInP LED that has been engineered to improve the reliability and the light output of the device. The LED includes a substrate 32, an optional distributed Bragg reflector layer 33, a lower confining layer 34, an active region 36, an optional upper set-back layer 38, an upper confining layer 40 and an optional window layer 42. The LED also includes two ohmic contacts 44 and 46 that provide the operating current to the LED. The substrate is made of a semiconductor material, such as GaAs or GaP. The lower confining layer is composed of an n-type AlGaInP material, while the upper confining layer is composed of a p-type AlGaInP. material. The upper set-back layer is formed of an undoped AlGaInP material. The optional upper set-back layer may be used to help control the diffusion of p-type dopants from the upper confining region into the active region during high temperature processing steps. The upper set-back layer and the active region may become p-type as a result of this diffusion process. (In a preferred embodiment, the device includes a p-type set-back layer.) As will be further described below, the upper set-back layer and/or the upper confining layer are/is doped with oxygen (O) to improve the reliability of the device. The LED may include an optional lower set-back layer (not shown) between the lower confining layer and the active region. The optional lower set-back layer may be formed of the same material as the upper set-back layer, although this is not necessarily the case. (As previously described, the most common LED configuration includes an n-type substrate, an n-type lower confining layer, an optional n-type lower set-back layer, an active region which may be n-type, p-type or undoped, an optional p-type set-back layer, a p-type upper confining layer, and an optional p-type window layer. It is possible, however, to grow the LED on, or bond or attach the LED to, a p-type substrate or other material, using a p-type lower confining layer, an optional p-type lower set-back layer, a p-type, n-type or undoped active region, an optional n-type upper set-back layer, an n-type upper confining layer, and an optional n-type window layer.)

Figure 3:
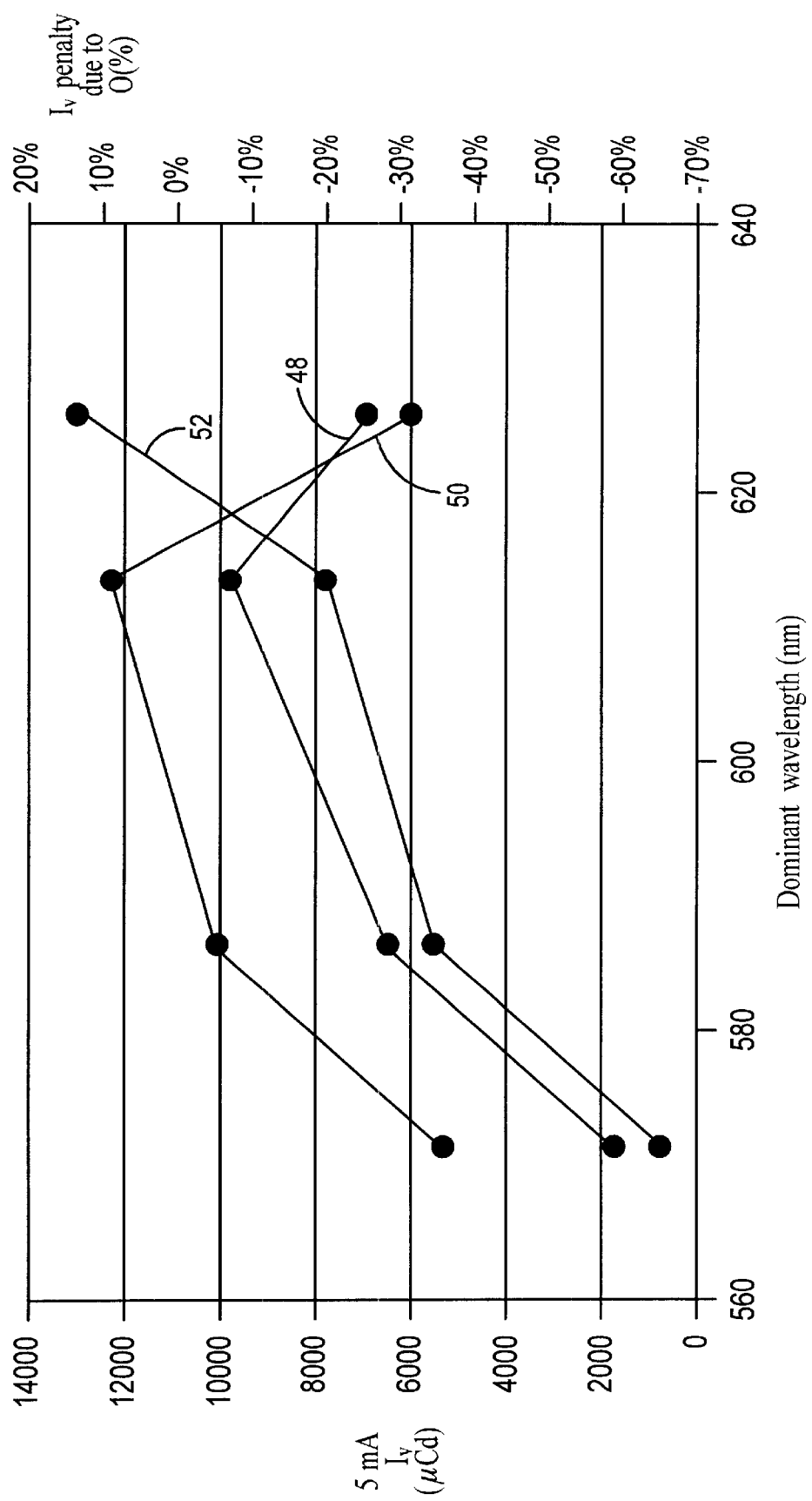
FIG. 3 is a graph that illustrates the dependence of oxygen (O) induced light output penalty on dominant emission wavelength of AlGaInP LEDs.

In one embodiment, only the upper confining layer 40 is doped with O. The O dopant concentration in the upper confining layer is dependent on the dominant emission wavelength of the LED 30. As described in U.S. Pat. No. 5,909,051 to Stockman et al., the inclusion of the O dopant in the p-type upper confining layer (adjacent to the active region) of an LED improves the reliability of the device. In most cases, the presence of O dopants results in a light output penalty. However, for AlGaInP LEDs that have been configured to generate light with a dominant emission wavelength of approximately 626 nm or longer, the inclusion of O dopants results in an increased light output. Illustrated in FIG. 3 is the dependence of the O induced light output penalty on dominant emission wavelength of AlGaInP LEDs. Plotted line 48 shows the light output ($I_v$) as a function of dominant wavelength where the upper confining layer of the LED has been doped with O at a concentration $\sim 1 \times 10^{18}$ cm$^{-3}$, while plotted line 50 shows the light output as a function of dominant wavelength where the upper confining layer of the LED has not been doped with O. Plotted line 52 shows the light output penalty (in percent) due to the O doping. As illustrated in FIG. 3, AlGaInP LEDs with a dominant emission wavelength of 570 nm suffer close to 70% penalty in light output or $I_v$ associated with the use of O in the upper confining layer. However, as the dominant emission wavelength of AlGaInP LEDs is increased from 570 nm to 585 nm and 615 nm, the light output penalties associated with the use of O are decreased approximately from 70% to 35% and 20%, respectively. For AlGaInP LEDs with a dominant emission wavelength of 626 nm, there is no light output penalty associated with the use of O. In fact, the light output of AlGaInP LEDs with a dominant emission wavelength of 626 nm is increased by the introduction of O in the upper confining layer.

Figure 4:
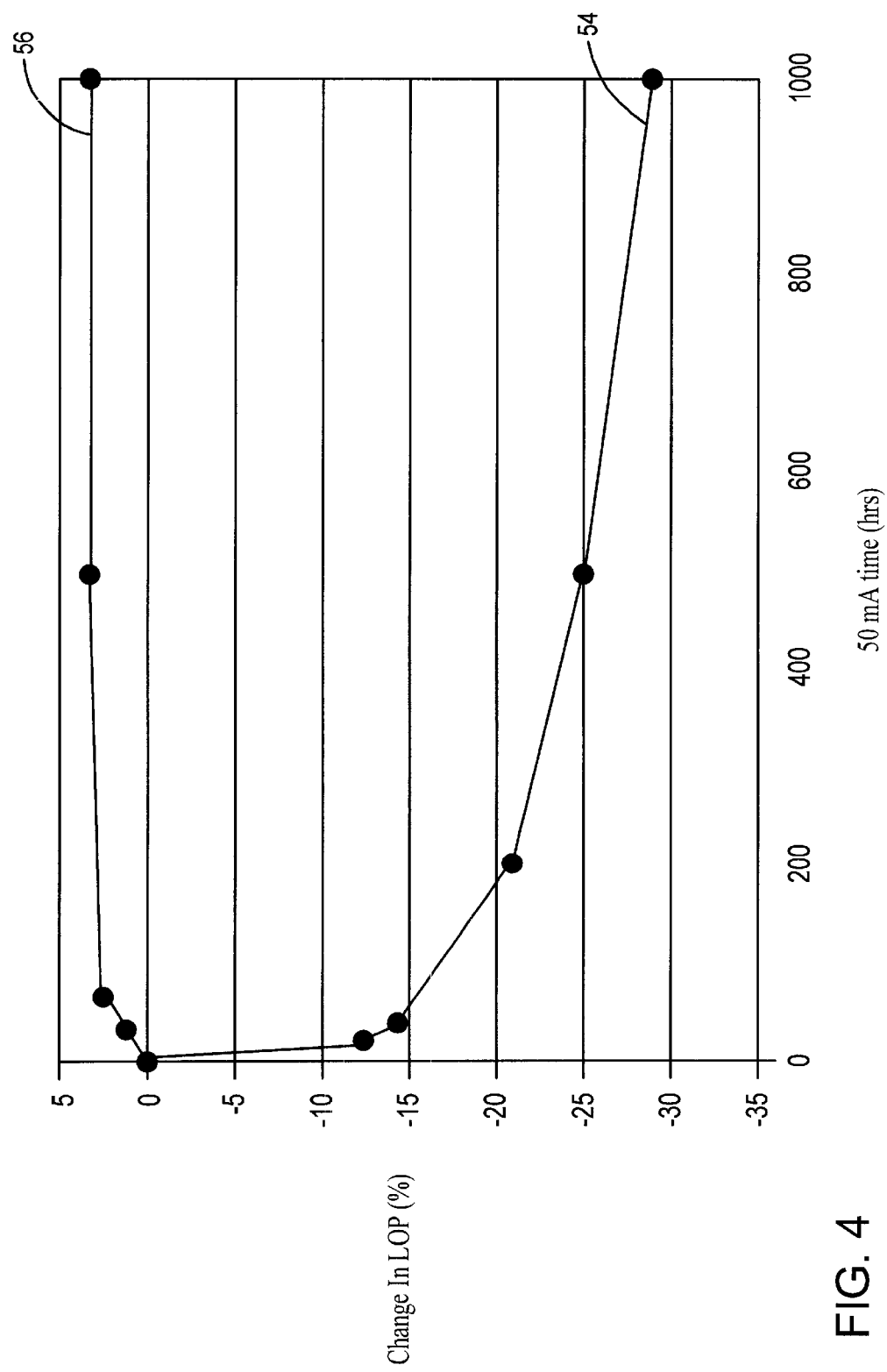
FIG. 4 is a graph that illustrates the change in light output over time for two red-orange LEDs (dominant wavelength of 615 nm) with different O concentrations.

In light of the above correlation, the O concentration in the a LED 30 of FIG. 2 can be varied in accordance with the dominant emission wavelength of the device to maximize the reliability of the device, while minimizing any light output penalty due to the O doping. For example, higher O concentrations can be used if the LED is configured to emit red light than if the LED is configured to emit amber light, since there is no light output penalty associated with the use of O in LEDs that are configured to emit light in the red portion of the light spectrum. A higher O concentration in the upper confining layer 40 of the LED equates to a more reliable device. The effect of this increased O concentration on reliability is shown in FIG. 4, which illustrates the change in light output over time for two red-orange LEDs (dominant wavelength of 615 nm) with different O concentrations. Plotted line 54 shows the light output over time for a red-orange LED with an O concentration of $<1\times10^{18}$ cm$^{-3}$, while plotted line 56 shows the light output over time for a red-orange LED with an O concentration of $4\times10^{18}$ cm$^{-3}$.

Taking the color dependency into consideration, the O concentration in the upper confining layer 40 of the LED 30 will proportionally vary depending on the configuration of the LED with respect to its dominant emission wavelength. If the LED is configured to have a dominant emission wavelength less than approximately 595 nm, the O concentration in the upper confining layer of the LED is between about $3\times10^{17}$ cm$^{-3}$ and $2\times10^{18}$ cm$^{-1}$. If the LED is configured to have a dominant emission wavelength between approximately 595 nm and approximately 620 nm, the O concentration is between about $4\times10^{17}$ cm$^{-3}$ and $4\times10^{18}$ cm$^{-3}$, preferably about $3\times10^{18}$ cm$^{-3}$. If the LED is configured to have a dominant emission wavelength greater than approximately 620 nm, the O concentration in the upper confining layer is between about $5\times10^{17}$ cm$^{-3}$ and $5\times10^{18}$ cm$^{-3}$, preferably $4\times10^{18}$ cm$^{-3}$. However, since there is no light output penalty associated with an LED having a dominant emission wavelength greater than approximately 626 nm, the O concentration may be much larger than $5\times10^{18}$ cm$^{-3}$ for such an LED. For an LED with dominant wavelength greater than approximately 626 nm, the O concentration may be up to as high as $5\times10^{19}$ cm$^{-3}$.

In a preferred embodiment, the light output penalty may be further mitigated through the use of a p-type upper set-back layer, where this layer may or may not be doped with O. In the case where O is introduced into the upper set-back layer 38 of the LED 30 of FIG. 2, the O concentration in the upper set-back layer is $<5\times10^{18}$ cm$^{-3}$ and preferably $<1\times10^{17}$ cm$^{-3}$, where the preferred O concentration decreases as the dominant emission wavelength decreases. Note that the O doping concentration in the upper set-back layer is thus much less than the O doping concentration in the upper confining layer. In addition to the other factors discussed above, i.e., thin wells, thin barriers, set-back layer composition, and high concentrations of acceptor atoms and O dopant atoms in the upper confining layer, this reduced O concentration in the upper set-back layer helps to further decouple the light output and reliability beyond that obtained with the method of Stockman et al.

In addition to the O dopants, the upper confining layer 40 of the LED 30 is preferably formed with high p-type dopant flow, such as magnesium, zinc, carbon, or beryllium, to introduce a high concentration of p-type dopants into the upper confining layer. The high concentration of p-type dopants in combination with the O dopants mitigates any light output penalty due to the introduction of O dopants.

Figure 5:
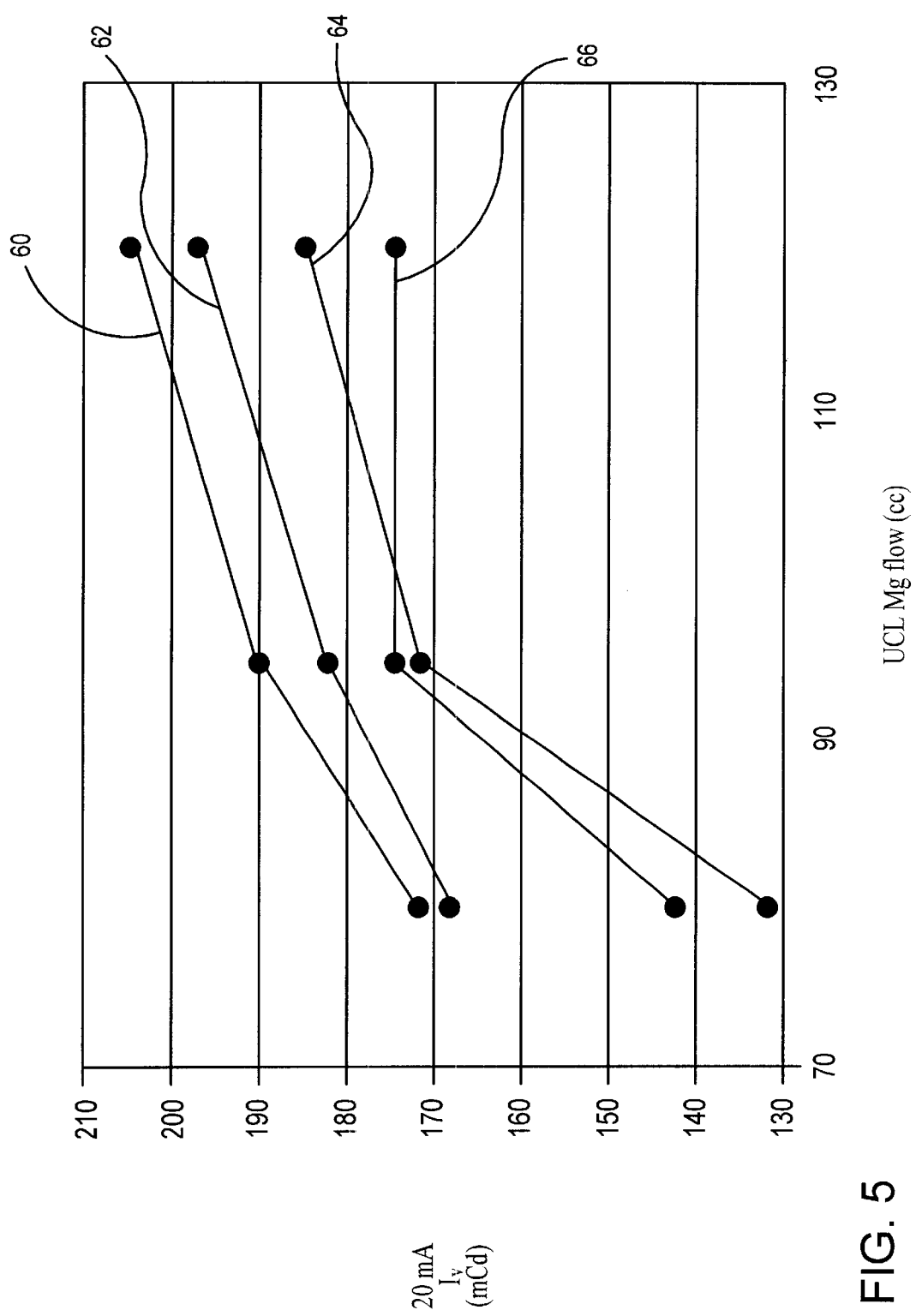
FIG. 5 is a graph that shows the light output of LEDs with various O concentrations as a function of the Mg dopant flow during the formation of the upper confining layer (UCL).

FIG. 5 shows the light output of LEDs with various combinations of O concentrations and Mg dopant flow during the formation of the upper confining layer (UCL). Plotted lines 60, 62, 64 and 66 correspond to LEDs with O concentrations of $1\times10^{18}$ cm$^{-3}$, $3\times10^{18}$ cm$^{-3}$, $4\times10^{18}$ cm$^{-3}$ and $5\times10^{18}$ cm$^{-3}$, respectively. FIG. 5 illustrates that the light output penalty due to O doping can be mitigated by the presence of a high concentration of p-type dopants, such as Mg, in the upper confining layer 40. Note from FIG. 5 that a combination of high O and high Mg results in a brighter LED than a combination of low O and low Mg.

In a preferred embodiment, the upper confining layer 40 of the LED 30 of FIG. 2 has been doped with a high concentration of p-type dopants, e.g., Mg, Zn, C, or Be. The concentration of p-type dopants in the upper confining layer is preferably greater than the standard concentration, which is typically $1\times10^{17}$ cm$^{-3}$ to $3\times10^{17}$ cm$^{-3}$. Thus, the concentration of p-type dopants in the upper confining layer should be between $3\times10^{17}$ cm$^{-3}$ and $1\times10^{19}$ cm$^{-3}$ prior to high temperature thermal processing. Subsequent high temperature thermal processing then results in p-type dopant diffusion into the upper set-back layer 38 and the active region 36, resulting in a heavily p-doped active region with a free hole concentration between approximately $1\times10^{17}$ cm$^{-3}$ and $3\times10^{18}$ cm$^{-3}$, preferably $3\times10^{17}$ cm$^{-3}$ and $6\times10^{17}$ cm$^{-3}$.

The upper set-back layer 38 thus helps to control p-type dopant diffusion into the active region 36, resulting in higher yields and a more manufacturable process. The upper set-back layer also helps to decouple the light output and reliability by separating the heavily O doped upper confining layer 40 from the active region. (Note that the O concentration in the upper set-back layer is much lower than that in the upper confining layer.) This is one major difference between the present invention and the prior art by Stockman et al., which states that the O doped region should be adjacent to the active region. An additional difference between the present invention and the prior art of Stockman et al. is that, in the case of a multi-well or multiple quantum well active region, the barrier layers between the active well layers are not doped with O. Thus, the O doped layers are not adjacent to the active layers.

The active region 36 of the LED 30 includes N light-emitting active layers 76, that are individually separated by N-1 barrier layers, where N is an integer greater than zero. Thus, the LED may be configured as a DH LED, in which there is only a single active layer (N=1). Although the LED is shown in FIG. 2 as having only six active layers and five barrier layers, the number of active layers and barrier layers may be significantly larger, i.e., the device may have as many as 50 or more active layers. The active layers and the barrier layers are composed of AlGaInP material.

The present inventors have demonstrated through extensive research that for a fixed total active layer thickness, D, as the number of active layers, N, is increased and as the individual active layer thickness, t, is consequently reduced, the light output from the LED is increased. This effect is shown in Table 1 (below) and in FIG. 6. Note that the present invention, which is based in part on this concept of reduced active layer thickness, t, and increased number of active layers, N, will work for active layer thicknesses down to approximately 10 Angstroms and a number of active layers of up to 50 or more.

TABLE 1

Effect of Number of Wells on LED Light Output
(with fixed total active layer thickness)

| Active layer type | Experiment number | 5 mA LED light output, $I_v$ ($\mu$Cd) |
|---|---|---|
| 4 wells each 500 Å thick | 1 | 8648 (@ 590 nm) |
| 8 wells each 250 Å thick | 1 | 12095 (@ 590 nm) |
| 16 wells each 125 Å thick | 1 | 15581 (@ 590 nm) |
| 4 wells each 500 Å thick | 2 | 8187 (@ 590 nm) |
| 16 wells each 125 Å thick | 2 | 9370 (@ 590 nm) |
| 25 wells each 80 Å thick | 2 | 10318 (@ 590 nm) |
| 4 wells each 500 Å thick | 3 | 14038 (@ 590 nm) |
| 16 wells each 125 Å thick | 3 | 15232 (@ 590 nm) |
| 4 wells each 250 Å thick | 4 | 10191 (@ 626 nm) |
| 8 wells each 125 Å thick | 4 | 11013 (@ 626 nm) |

Figure 6:
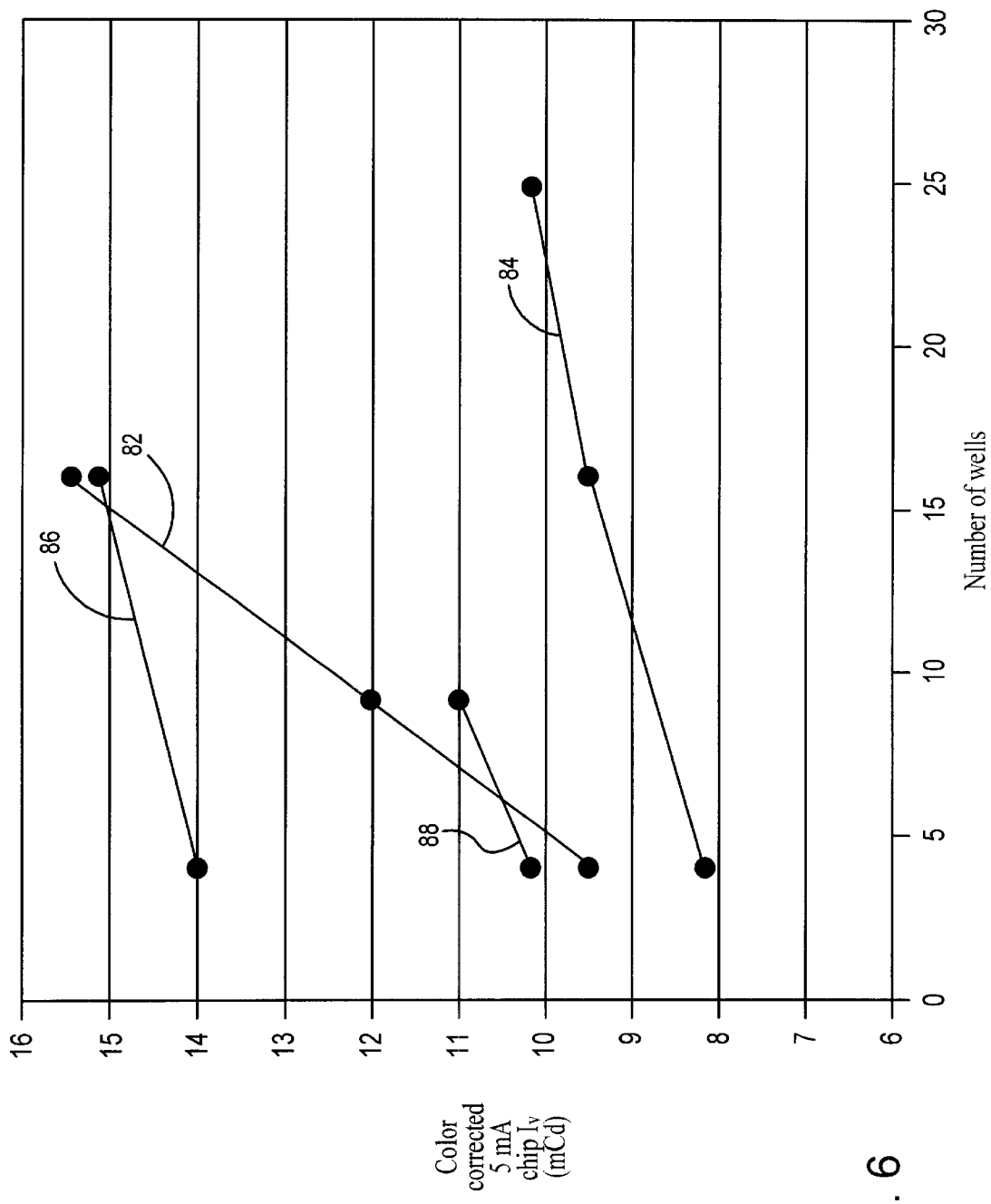
FIG. 6 is a graph that illustrates the improvement of light output with an increasing number of wells for a fixed total active layer thickness.

As shown in Table 1, experiments 1, 2 and 3 are directed to LED structures that emit amber color light (dominant wavelength=590 nm), while experiment 4 is directed to LED structures that emit red color light (dominant wavelength= 626 nm). The preferred total active layer thickness for amber or orange LEDs is in the range from approximately 500 Angstroms to approximately 2000 Angstroms. The preferred total active layer thickness for red-orange or red LEDs is in the range from approximately 125 Angstroms to approximately 1000 Angstroms. In FIG. 6, plotted lines 82, 84, 86 and 88 correspond to the LED structures of the experiments 1, 2, 3 and 4 described in Table 1, respectively. The plotted lines 82, 84 and 86 in FIG. 6 refer specifically to amber LEDs with a total active layer thickness fixed at approximately 2000.Angstroms, while plotted line 88 refers specifically to red LEDs with a total active layer thickness fixed at approximately 1000 Angstroms.

The target thickness of the barrier layers and their composition were also found to affect the light output of LEDs. As shown in Table 2, a decrease in the target thickness of the barrier layers results in an increase in the LED light output.

TABLE 2

Effect of Barrier Thickness on LED Light Output

| Active layer type | Experiment number | Barrier thickness | 5 mA LED light output, $I_v$ ($\mu$Cd) |
|---|---|---|---|
| 8 wells each 250 Å thick | 1 | 350 Å | 8470 (@ 590 nm) |
| 8 wells each 250 Å thick | 1 | 150 Å | 15841 (@ 590 nm) |
| 16 wells each 125 Å thick | 2 | 350 Å | 14367 (@ 590 nm) |
| 16 wells each 125 Å thick | 2 | 150 Å | 16777 (@ 590 nm) |
| 16 wells each 125 Å thick | 3 | 150 Å | 8068 (@ 590 nm) |
| 16 wells each 125 Å thick | 3 | 100 Å | 11187 (@ 590 nm) |

The effect of barrier composition on the LED light output is shown below in Table 3. The barrier composition refers to the percentage of Al, x, in the barrier layers of the LED, which are composed of the alloy $(Al_xGa_{1-x})_{0.5}In_{0.5}P$. As shown in Table 3, an increase in the Al percentage corresponds to an increase in the LED light output. Since the Al content in the barrier layers relates to the energy bandgap of the barrier layers, the increase in the Al percentage can be viewed as an increase in the energy bandgap of the barrier layers.

TABLE 3

Effect of Barrier Composition on LED Light Output

| Active layer type | Experiment number | Barrier composition | 5 mA LED light output, $I_v$ ($\mu$Cd) |
|---|---|---|---|
| 8 wells each 250 Å thick | 1 | X = 0.65 | 11430 (@ 590 nm) |
| 8 wells each 250 Å thick | 1 | X = 1 | 12406 (@ 590 nm) |
| 16 wells each 125 Å thick | 2 | X = 0.65 | 22754 (@ 590 nm) |
| 16 wells each 125 Å thick | 2 | X = 0.65 | 21327 (@ 590 nm) |
| 16 wells each 125 Å thick | 2 | X = 0.65 | 24795 (@ 590 nm) |
| 16 wells each 125 Å thick | 2 | X = 1 | 37182 (@ 590 nm) |

Figure 7:
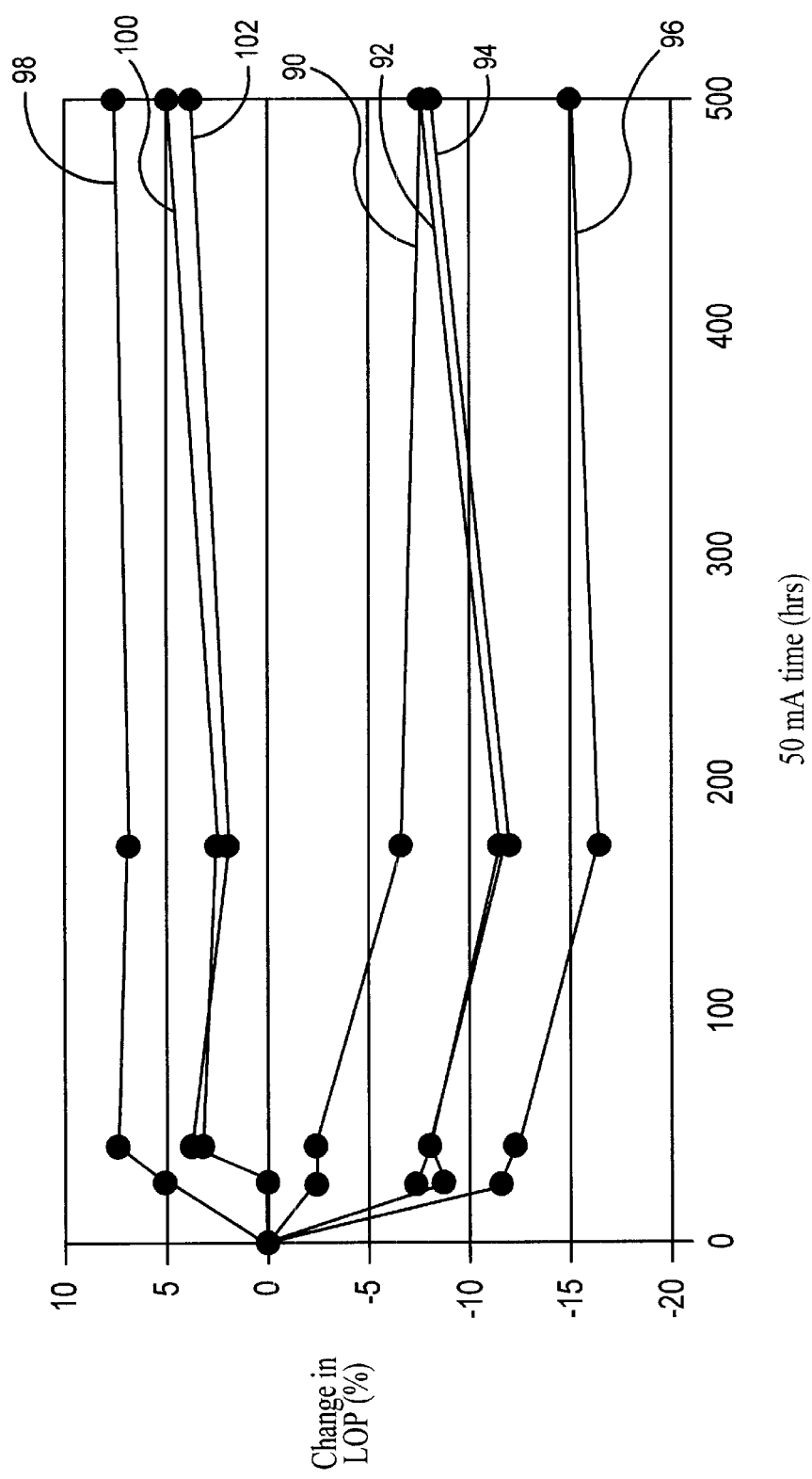
FIG. 7 is a graph that illustrates the improvement of reliability with an increasing number of wells for a fixed total active layer thickness.

An additional advantage of increasing the number of wells for a fixed total active layer thickness in accordance with the invention is that the reliability of the resulting devices are superior to that of previous LED designs. This is particularly true for amber AlGaInP LEDs. In FIG. 7, the reliability of LEDs with 4 wells, each 500 Å thick, and the reliability of LEDs with 16 wells, each 125 Å thick, are illustrated. Plotted lines 90, 92, 94 and 96 correspond to the LEDs with 4 wells, each 500 Angstroms thick, while plotted lines 98, 100 and 102 correspond to the LEDs with 16 wells, each 125 Angstroms thick. Thus, the devices with 16 wells, each 125 Angstroms thick, are superior in reliability to the devices with 4 wells, each 500 Angstroms thick.

In light of the above-described advantages, the individual active layers 76 included in the active region 36 should be reduced in thickness to 125 Angstroms or less without changing the total active layer thickness. Consequently, the number of individual active layer wells in the LED should be in the range from eight wells to sixteen or more wells for LEDs with a dominant emission wavelength<approximately 610 nm, and should be in the range from one well to eight or more wells for an LED with dominant emission wavelength>approximately 610 nm. The optimal total active layer thickness, D, and hence the optimal number of wells N, will depend on whether the device includes a transparent substrate or an absorbing substrate. Since absorption in the active layers is one of the dominant absorption mechanisms in transparent substrate LEDs, the total active layer thickness, D, should be thinner in a transparent substrate LED than in an absorbing substrate LED. (Note that a transparent substrate LED includes any LED which is grown on or bonded to or otherwise attached to a material or materials which are transparent to the light emitted from the active region, including such materials as GaP, GaAsP, InGaP, sapphire, SiC, glass, etc.) The composition of the active layers will depend on the desired dominant emission wavelength of the LED 30. In general, the active layers are made of $(Al_xGa_{1-x})_yIn_{1-y}P$, where $0 \leqq x \leqq 0.55$ and $y=0.5\pm0.1$. For a dominant emission wavelength less than approximately 610 nm, the value of x should be greater than about 0.15. For a dominant-emission wavelength of approximately 615 nm, the value of x should be between about 0.06 and 0.15. Lastly, for a dominant emission wavelength greater than approximately 626 nm, the value of x should be less than about 0.06. With respect to the barrier layers 78, the individual thickness should be less than 350 Angstroms, preferably 100 Angstroms or less. The composition of the barrier layers 78 should be $(Al_xGa_{1-x})_yIn_{1-y}P$, where $y=0.5\pm0.1$ and $x\geq0.6$. In a preferred embodiment, x=1 such that the composition of the barrier layers is $Al_yIn_{1-y}P$, where $y=0.5\pm0.1$.

Figure 8:
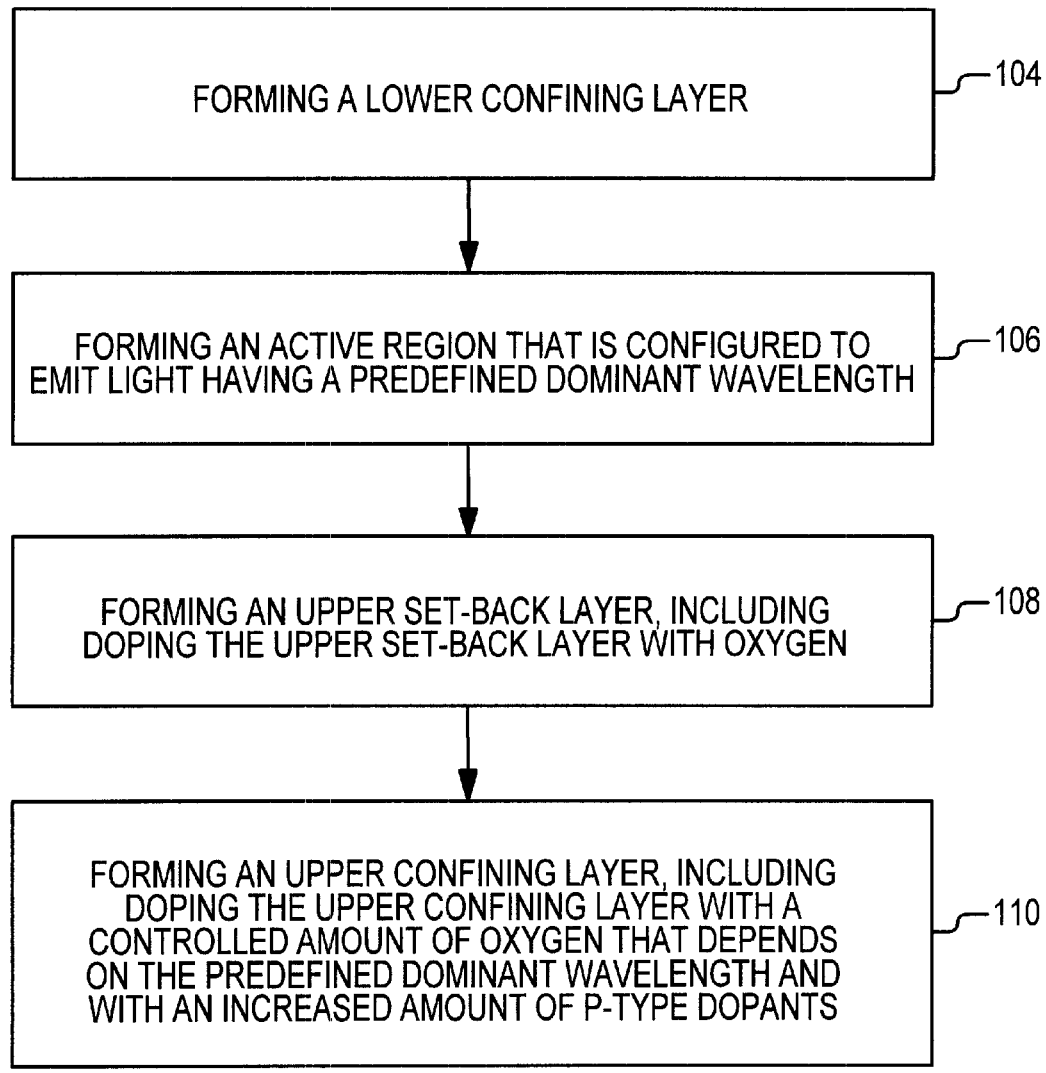
FIG. 8 is a flow diagram of a method of fabricating the LED of FIG. 2 in accordance with the invention.

A method of fabricating the LED 30 of FIG. 2 in accordance with the invention will be described with reference to FIGS. 2 and 8. During step 104, the lower confining layer 34 is formed on the substrate 32. Next, during step 106, the active region 36 is formed on the lower confining layer, such that the active region is configured to emit light having a predefined dominant wavelength. In one embodiment, the active region may be formed to include a single light emitting active layer 76. In other embodiments, the active region is formed to include N light emitting active layers 76 and N−1 barrier layers, where N is an integer greater than one. If the predefined dominant wavelength is in the amber to orange portion of the light spectrum, the fixed total active layer thickness is preferably between about 500 Angstroms and about 2000 Angstroms. However, if the predefined dominant wavelength is in the red-orange to red portion of the light spectrum, the fixed total active layer thickness is preferably between about 125 Angstroms and about 1000 Angstroms. The preferred target thickness of the individual active layers is approximately 125 Angstroms or less. Therefore, the number of active layers is between approximately eight and sixteen, for an LED with dominant emission wavelength<approximately 610 nm, and is between approximately one and eight if the dominant emission wavelength is>approximately 610 nm. (Note that the invention will work for a number of active layers of up to 50 or more and active layer thickness down to approximately 10 Angstroms.) The composition of the active layers will also depend on the predefined dominant emission wavelength. With respect to the barrier layers 78 of the active region 36, the individual thickness of the barrier layers is preferably less than 350 Angstroms, e.g., 100 Angstroms. The composition of the barrier layers is $(Al_xGa_{1-x})_yIn_{1-y}P$, where $x>0.6$ and $y=0.5\pm0.1$. Preferably, the barrier layers are made of $Al_{0.5}In_{0.5}P$.

During step 108, the optional (p-type) upper set-back layer 38 is formed on the active region 36 and is doped with O, such that the O concentration in the upper set-back layer is $<5\times10^{18}$ cm$^{-3}$, and preferably is $<1\times10^{17}$ cm$^{-3}$, where the O concentration in the p-type set-back layer decreases as the LED dominant emission wavelength decreases. During step 110, the (p-type) upper confining layer 40 is formed on the upper set-back layer and is doped with a controlled amount of O that also depends on the predefined dominant emission wavelength. If the LED is configured to have a dominant emission wavelength less than approximately 595 nm, the O concentration in the upper confining layer of the LED is between about $3\times10^{17}$ cm$^{-3}$ and $2\times10^{18}$ cm$^{-3}$. If the LED is configured to have a dominant emission wavelength between approximately 595 nm and approximately 620 nm, the O concentration is between about $4\times10^{17}$ cm$^{-3}$ and $4\times10^{18}$ cm$^{-3}$, preferably about $3\times10^{18}$ cm$^{-3}$. If the LED is configured to have a dominant emission wavelength greater than approximately 620 nm, the O concentration in the upper confining layer is between about $5\times10^{17}$ cm$^{-3}$ and $5\times10^{18}$ cm$^{-3}$, preferably $4\times10^{18}$ cm$^{-3}$. In addition to the O doping, the upper confining layer is doped with an increased amount of p-type dopants, such as Mg, Zn, C, or Be. The resulting upper confining layer has a p-type dopant concentration between approximately $1\times10^{17}$ cm$^{-3}$ and $1\times10^{19}$ cm$^{-3}$, prior to high temperature thermal processing. Subsequent high temperature thermal processing then results in p-type dopant diffusion into the active layer(s), resulting in a heavily p-doped active layer(s) with a free hole concentration between approximately $1\times10^{17}$ cm$^{-3}$ and $3\times10^{18}$ cm$^{-3}$, preferably between $3\times10^{17}$ cm$^{-3}$ and $6\times10^{17}$ cm$^{-3}$.

Although the invention was described with respect to an AlGaInP LED, the various features disclosed herein are applicable to different light emitting devices, such as other types of LEDs and laser diodes.

It should be noted that the preferred method of fabricating the structures described here is by MOCVD, however different fabrication methods, such as MBE or VPE could also be used. Also, in addition to the GaAs substrate described here, the present invention could also be grown on or otherwise mechanically attached to other substrate materials such as GaP, InGaP, Si, Ge, GeSi, metals, glass, or other materials. The conductivity type of the various layers could also be modified such that the device is grown on a p-type substrate, with p-type lower confining layer, optional p-type lower set-back layer, active layer, optional n-type upper set-back layer, n-type upper confining layer, and n-type window layer. In such case, the p-type set-back and/or p-type confining layer should be doped with O. The device described here has been described with an optional window layer which could be composed of materials such as $(Al_xGa_{1-x})_yIn_{1-y}P$, where $0\leq x\leq 1$ and $0\leq y\leq 1$, or it could be composed of AlGaAs, or other materials. In addition to the p-type active layer described here, the device could also be fabricated with an undoped active layer or an n-type active layer. While the device described here includes from one to sixteen wells, the device could also be grown with more than sixteen wells. The device could also be grown with lattice mismatched layers in the active layer wells, the active region barriers, set-back layers or confining layers. Also, while the preferred method includes O doping of the p-type confining layer and/or p-type set-back layer, additional dopants could include Si, Se, S, Te, Sn, Ge, N or As. The device could also be made by wafer bonding to GaP, Si, Ge, GeSi, metals, glass, or any other substrate material. The device could also include a region of graded composition with one or more layers, such as the optional upper set-back layer, the optional lower set-back layer, the barrier layers within the active region, or other layers within the device being composed of compositions of $(Al_xGa_{1-x})_yIn_{1-y}P$, where x and/or y are changed within a given layer. The device could also be grown or otherwise manufactured with a current blocking layer underneath the p-type or n-type ohmic contact.

What is claimed is:

1. A light emitting device comprising:

a substrate;

a lower region of a first conductivity type positioned over said substrate;

an active region positioned over said lower region, said active region including a plurality of light emitting active layers; and an upper region of a second conductivity type positioned over said active region, wherein at least one of said upper and lower regions includes an oxygen-doped layer with a controlled concentration of oxygen dopants, and wherein the device includes a dominant emission wavelength, said controlled concentration of oxygen dopants being dependent on said dominant emission wavelength of said device.

2. The device of claim 1 further comprising a set-back layer included in one of said lower and upper regions, said set-back layer being positioned between said oxygen-doped layer and said active region.

3. The device of claim 2 wherein said set-back layer is oxygen-doped.

4. The device of claim 1 wherein said oxygen-doped layer is a set-back layer included in one of said lower and upper regions.

5. The device of claim 1 wherein said controlled concentration of oxygen dopants is between approximately $3 \times 10^{17}$ $cm^{-3}$ and $5 \times 10^{19}$ $cm^{-3}$.

6. The device of claim 1 wherein said device is configured to emit light having a dominant wavelength less than approximately 595 nm, and wherein said controlled concentration of oxygen dopants is between approximately $3 \times 10^{17}$ $cm^{-3}$ and $2 \times 10^{18}$ $cm^{-3}$.

7. The device of claim 1 wherein said device is configured to emit light having a dominant wavelength between approximately 595 nm and 620 nm, and wherein said controlled concentration of oxygen dopants is between approximately $4 \times 10^{17}$ $cm^{-3}$ and $4 \times 10^{18}$ $cm^{-3}$.

8. The device of claim 1 wherein said device is configured to emit light having a dominant wavelength greater than approximately 620 nm, and wherein said controlled concentration of oxygen dopants is between approximately $5 \times 10^{17}$ $cm^{-3}$ and $5 \times 10^{18}$ $cm^{-3}$.

9. The device of claim 1 wherein one of said lower and upper regions includes a p-type confining layer, said p-type confining layer having a concentration of p-type dopants, said concentration of p-type dopants being between approximately $1 \times 10^{17}$ $cm^{-3}$ and $1 \times 10^{19}$ $cm^{-3}$.

10. The device of claim 9 wherein each of said p-type dopants is an element selected from a group consisting of magnesium, zinc, carbon and beryllium.

11. The device of claim 1 wherein at least one layer of said light emitting active layers in said active region has a p-type doping concentration between approximately $1 \times 10^{17}$ $cm^{-3}$ and $3 \times 10^{18}$ $cm^{-3}$.

12. The device of claim 1 wherein said active region includes alternating light emitting active layers and barrier layers, where the number of said light emitting active layers is between 2 and 50.

13. The device of claim 1 wherein said device is configured to emit light having a dominant wavelength greater than approximately 610 nm, and wherein said active region includes two to eight light emitting active layers.

14. The device of claim 1 wherein each of said light emitting active layers in said active region has a thickness of less than or equal to approximately 125 Angstroms.

15. The device of claim 1 wherein said active region includes at least one barrier layer, said barrier layer having a thickness less than approximately 350 Angstroms.

16. The device of claim 15 wherein said active region includes at least one barrier layer having a thickness less than or equal to approximately 100 Angstroms.

17. The device of claim 1 further comprising a window layer positioned above said upper region, said window layer being substantially composed of GaP.

18. The device of claim 1 further comprising a distributed Bragg reflector positioned between said substrate and said lower region.

19. The device of claim 1 wherein said substrate is composed of a material which is transparent to the light emitted by said active region.

20. A light emitting device comprising:

a substrate;

a lower region of a first conductivity type positioned over said substrate;

an active region positioned over said lower conductive region; and an upper region of a second conductivity type positioned over said active region, wherein one of said lower and upper regions includes an oxygen-doped layer and a set-back layer, said oxygen-doped layer being separated from said active region by at least said set-back layer, said oxygen-doped layer having an oxygen dopant concentration that is dependent on the dominant emission wavelength of said device, said oxygen dopant concentration being selectively defined to improve the reliability of said light emitting device while substantially minimizing any penalty in initial light output due to said oxygen dopant concentration.

21. The device of claim 20 wherein said device is configured to emit light having a dominant wavelength less than approximately 595 nm, and wherein said oxygen dopant concentration is between approximately $3 \times 10^{17}$ $cm^{-3}$ and $2 \times 10^{18}$ $cm^{-3}$.

22. The device of claim 20 wherein said device is configured to emit light having a dominant wavelength between approximately 595 nm and 620 nm, and wherein said oxygen dopant concentration is between approximately $4 \times 10^{17}$ $cm^{-3}$ and $4 \times 10^{18}$ $cm^{-3}$.

23. The device of claim 20 wherein said device is configured to emit light having a dominant wavelength greater than approximately 620 nm, and wherein said oxygen dopant concentration is between approximately $5 \times 10^{17}$ $cm^{-3}$ and $5 \times 10^{18}$ $cm^{-3}$.

24. The device of claim 20 wherein said active region includes a plurality of light emitting active layers, each of said light emitting active layers having a thickness less than or equal to approximately 125 Angstroms.

25. The device of claim 20 wherein said active region includes one or more barrier layers, said barrier layers having a thickness less than or equal to approximately 100 Angstroms.

26. The device of claim 25 wherein said composition of said barrier layers is $Al_y In_{1-y} P$, where $y = 0.5 \pm 0.1$.

* * * * *